United States Patent [19]

Farber et al.

[11] 4,292,150

[45] Sep. 29, 1981

[54] IODINE TREATED ELASTOMERIC ARTICLE

[75] Inventors: Milton Farber, Bethany, Conn.; Nancy S. Mariotti, Buchanan, Mich.

[73] Assignee: Uniroyal, Inc., New York, N.Y.

[21] Appl. No.: 52,166

[22] Filed: Jun. 26, 1979

[51] Int. Cl.³ .............................................. C08F 2/48
[52] U.S. Cl. .......................... 204/159.12; 204/159.14; 204/159.17; 204/159.18; 204/159.20; 204/159.22; 430/286; 430/300; 430/302; 430/927; 525/305; 525/1
[58] Field of Search ...................... 204/159.12, 159.17, 204/159.18, 159.14, 159.20, 159.22; 430/286, 300, 302, 927

[56] References Cited

U.S. PATENT DOCUMENTS

| | | | |
|---|---|---|---|
| 3,674,486 | 7/1972 | Milgrom | 430/286 |
| 4,023,973 | 5/1977 | Imaizumi et al. | 430/927 |
| 4,045,231 | 8/1977 | Toda et al. | 204/159.17 |
| 4,152,231 | 5/1979 | St. Clair et al. | 204/159.17 |
| 4,162,919 | 7/1979 | Richter et al. | 430/286 |

*Primary Examiner*—Harold D. Anderson
*Attorney, Agent, or Firm*—Andrew D. Maslow; Thomas A. Beck

[57] ABSTRACT

An elastomeric article suitable for flexographic printing comprising an elastomeric natural or synthetic dienoid polymer or copolymer, a photopolymerizable, ethylenically unsaturated crosslinking agent and a photoinitiator, portions of said article having been exposed to a photopolymerizable-effective amount of actinic radiation through an image bearing transparency having clear and opaque areas, and processed to remove the soluble portion of said plate situated beneath the opaque areas of the transparency during exposure, and said processed plate having been treated with iodine so as to render its printing surface tack-free and resistant to hardening when further exposed to actinic radiation.

37 Claims, No Drawings

IODINE TREATED ELASTOMERIC ARTICLE

BACKGROUND OF THE INVENTION

1. Field of the Invention

The present invention relates to an elastomeric article which is designed to be used primarily in a flexographic printing system. Flexographic printing is a method of rotary letterpress printing which employs flexible elastomer printing plates. In this system the ink is transferred directly from the raised surfaces of the elastomeric plate to the printing stock.

By way of contrast, many references in the prior art disclose a resinous relief plate which is designed to be used in a letterset printing system. Letterset printing is a method of rotary printing which employs an elastomeric printing blanket. In this system the ink is transferred from the raised surfaces of the resinous plate to a rubber blanket which in turn transfers the inked image to the printing stock.

The main difference between the flexographic and letterset printing methods is that the transfer of the inked image is direct in the former and indirect in the latter.

In both the flexographic and letterset systems noted above, it is necessary to have a resilient member at the point of ink transfer to the printing stock. In flexographic printing the elastomeric plate is the resilient distortable member whereas in letterset printing the rubber blanket is the resilient distortable member. Thus a resinous printing plate (as described in the prior art) is not generally used in a flexographic system because it does not possess the suitable resilient properties necessary to effect a smooth uniform transfer of ink directly from the printing plate to the material to be printed.

The utility of a printing plate is the sum total of its properties, that is, in order to be commercially useful, a plate must possess the proper strength, durability, resistance to tear, resistance to solvents, hardness and swell characteristics. Many of these properties mentioned are a function of the polymer matrix which is used as the predominant constituent in the compositions which comprise the plate. After careful evaluation, the elastomers set forth hereinafter were selected as suitable for the matrix polymer for the instant invention since plates made from them possessed the desirable properties noted above, especially with respect to resistance to printing ink solvents.

The distinction between resinous and elastomeric polymers as used in the printing arts is not one of mere form but rather is one of significant substance.

"Properties and Structures of Polymers" by A. V. Tobolsky, pp. 771-78, John Wiley & Sons, Inc., Publishers (1960) discloses criteria for determining whether a polymeric material is a resin or an elastomer. Those polymeric materials which at ambient temperatures possess glassy characteristics and a Young's modulus in excess of $10^9$ dynes/cm$^2$ are designated resins. Conversely, those polymeric materials which at ambient temperatures are leathery or rubbery in nature and which possess a Young's modulus between $10^5$ and $10^9$ dynes/cm$^2$ are designated elastomers. This distinction is presented to emphasize that there is no basis for considering a resin and an elastomer as "equivalents" for the purpose of the present invention.

2. Description of the Prior Art.

There are no known post-treatments for flexographic plates of the type used in the present invention which both detackify and protect the printing surface from the phenomenon referred to and described hereinafter as "post-hardening due to light." Treatment with aqueous chlorine (acidified laundry bleach) has been used for detackification; however this treatment offers no protection from post-hardening due to light.

SUMMARY OF THE INVENTION

Flexographic photopolymer printing plates of the present invention comprise three elements:
1. An elastomeric dienoid polymer matrix,
2. A photopolymerizable, ethylenically unsaturated crosslinking agent, as typified by esters of acrylic or methacrylic acid and
3. A photoinitiator, which is a compound, which when irradiated, will initiate polymerization and/or crosslinking.

The article of the present invention, comprising a layer of the aforesaid photopolymerizable composition optionally adhered to a backing layer, is exposed to actinic radiation through an image-bearing process transparency, consisting of substantially clear and opaque areas, placed in intimate contact with the photopolymerizable layer. The irradiation causes insolubilization in the area of the layer underneath the clear area of the process transparency, but substantially no insolubilization occurs in the unexposed areas underneath the opaque areas of the process transparency. After this irradiation, the article is treated with a solvent such as a halogenated hydrocarbon, which removes the unexposed soluble areas of the plate. The resulting relief surface can now be used for printing, either as a plate, or in sleeve form.

Plates or sleeves prepared in the fashion outlined above frequently are tacky and cannot be stacked. In addition they must be protected from further exposure to light, since this exposure can cause them to harden excessively and embrittle the surface. The most frequently used detackification process involves treatment of the plate with aqueous chlorine generated by acidification of commercial laundry bleach (sodium hypochlorite). This treatment, although it does detackify the plate surface, offers no protection against the actinic post-hardening described above. The chlorine solutions are corrosive and give off chlorine gas, which is highly toxic, and thus are most undesirable.

The present invention offers a convenient way of not only detackifying the plates but also protecting them from actinic post-hardening. The invention involves treatment of the plate with iodine for a period of time, ranging from a few seconds to a few minutes. Elementary iodine appears to be the active material, and it may be applied in solution, most conveniently dissolved in aqueous potassium iodide. In such a solution, the iodine exists in equilibrium with the triiodide anion, in accordance with the following equation:

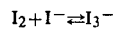

$$I_2 + I^- \rightleftharpoons I_3^-$$

This equilibrium provides for a convenient reservoir of iodine, since most of it is present as $I_3$. As a consequence, there is little or no danger of toxic exposure to iodine. The solution can be handled with no unusual precautions and stored indefinitely with no appreciable loss of activity.

Alternatively the iodine treatment may be carried out with the iodine dissolved in a non-aqueous medium such as alcohols or aliphatic or halogenated hydrocarbons which would not excessively swell the flexographic plate. Another alternative would be to expose the plate to iodine vapors.

The polymers which are operable in the present invention comprise natural and synthetic dienoid elastomers. Synthetic elastomers include homopolymers of conjugated diolefin hydrocarbons and copolymers of such diolefins with mono-olefinic compounds copolymerizable therewith. Such mono-olefins include styrene, alpha-methylstyrene, p-methylstyrene, alpha-p-dimethylstyrene, acrylic and methacrylic nitriles, amides, acids and esters, vinylpyridines, fumaric esters, methylenemalonic esters, vinylidene chloride, methyl vinyl ketone and methyl isopropenyl ketone. Mixtures of such mono-olefinic compounds can also be polymerized with the diolefin. Of particular usefulness as the elastomeric polymer matrix are butadiene-acrylonitrile copolymers as prepared by the method described in U.S. Pat. No. 1,937,000, butadiene copolymers and block copolymers of butadiene or isoprene with styrene of the S-B-S and S-I-S types as prepared by the method described in U.S. Pat. No. 3,265,765.

In order to maintain elastomeric properties, these copolymers should comprise at least 50% by weight of diene. In the case of nitrile rubber, the copolymer contains 2 to 50% by weight of the copolymerized acrylonitrile (preferably 20 to 40% by weight) the balance comprising 1,3-butadiene.

In a styrene-butadiene copolymer rubber, the copolymer contains 21 to 45% of the copolymerized styrene. In a styrene-butadiene or styrene-isoprene block copolymer, the copolymer contains 10 to 40% copolymerized styrene.

It is also within the scope of the invention to employ polybutadiene, or elastomeric polymers of 1,2-polybutadiene, or copolymers or diolefins with one or more unsaturated vinylidene monomers having at least one terminal $CH_2C=$ wherein the mono-olefinic compound is greater than 50% by weight of the copolymer.

Addition polymerizable ethylenically unsaturated crosslinking agents suitable for use in the invention include unsaturated esters of polyols, particularly such esters with alpha-methylene carboxylic acids, e.g. ethylene glycol diacrylate, diethylene glycol diacrylate, glycerol diacrylate, glycerol triacrylate, mannitol poly acrylate, sorbitol polyacrylate, ethylene glycol dimethacrylate, 1,3-propanediol dimethacrylate, 1,2,4-butanetriol trimethacrylate, 1,4-butanediol diacrylate and dimethacrylate 1,4-cyclohexanediol diacrylate, 1,4-benzenediol dimethacrylate, isosorbidene diacrylate, pentaerythritol di-tri-and-tetra-methacrylate, dipentaerythritol polyacrylate, pentaerythritol di, tri-, and tetraacrylates, 1,3-propanediol diacrylate, 1,6 hexanediol diacrylate and dimethacrylate, 1,5pentanediol dimethacrylate, trimethylolpropane triacrylate the bisacrylates and methacrylates of polyethylene glycols of molecular weight 200 to 4000; unsaturated amides, particularly those of the alpha-methylene carboxylic acids, and especially those of alpha, omega-diamines, such as methylene bisacrylamide, methylene bis-methacrylamide, ethylene bis-methacrylamide, 1,6-hexamethylene bisacrylamide, diethylene triamine tris-methacrylamide, 1,2-di(gamma-methacrylamidopropoxy)-ethane, beta-methacrylamidoethyl methacrylate, N-$\beta$-hydroxyethyl)-2-(methacrylamido)ethyl acrylate and N,N-bis($\beta$-methacrylyloxyethyl)-acrylamide; vinyl esters such as divinyl succinate, divinyl adipate, divinyl phthalate, divinyl terephthalate, divinyl benzene-1,3-disulfonate, divinyl butane-1,4-disulfonate and unsaturated aldehydes, such as sorbal dehyde (hexadienal). An outstanding class of those preferred addition polymerizable crosslinking agents are the esters and amides of alpha-methylene carboxylic acids and substituted carboxylic acids with polyols and polyamines wherein the molecular chain between the hydroxyls and amino groups is solely carbon or oxygen-interrupted carbon.

The useful addition polymerization and/or crosslinking initiators are those activatable by actinic light and thermally in active at and below 185° C. These include aromatic ketones such as benzophenone and substituted benzophenones, the substituted or unsubstituted polynuclear quinones which are compounds having two intracyclic carbonyl groups attached to intracyclic carbon atoms in a conjugated six-membered carbocylic ring, there being at least one aromatic carbocyclic ring fused to the ring containing the carbonyl groups. Suitable such initiators include 9,10-anthraquinone, 1-chloroanthraquinone, 2-chloroanthraquinone, 2-methylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alpha-sulfonic acid, 3-chloro-2-methylanthraquinone, retenequinone, 7,8.9,10-tetrahydronaphthacenequinone, and 1,2,3,4tetrahydrobenz(a)-anthracene-7,12-dione. Other photoinitiators which are also useful are described in U.S. Pat. No. 2,760,863 and include vicinal ketaldonyl compounds, such as diacetyl, benzil, etc.; $\alpha$-ketaldonyl alcohols, such as benzoin, pivaloin, etc., acyloin ethers, e.g. benzoin methyl and ethyl ethers, etc., $\alpha$-hydrocarbon substituted aromatic acyloins, including $\alpha$-methylbenzoin, $\alpha$-allylbenzoin and $\alpha$-phenylbenzoin.

The amounts of each component, relative to 100 parts of polymer matrix are 5 to 50 parts of ethylenically unsaturated cross linking agent and 0.1 to 5 of photosensitizer. (Where the expression "phr" is used herein it designates parts of a constituent per 100 parts of rubber.)

The treatment of the processed plate with iodine is carried out by immersing it in the iodine solution for from 5 seconds to 30 minutes or longer and thereafter rinsing and drying it. The duration of the treatment is dependent upon the concentration of iodine in the treating solution, with low concentrations requiring longer treating times and higher concentration permitting shorter treatment. A practical range of concentration for the iodine treating solution is from about 0.01 to about 10 normal in either aqueous potassium iodide in a non-aqueous solvent.

A useful range of iodine content in the treated plate is from about 1% to about 15% and a preferred range would be about 4% to 12%. Higher uptakes of iodine are not only uneconomical but result in embrittlement of the plate. A processed sample of plate of the formula:

100 parts butadiene-acrylonitrile copolymer (30% acrylonitrile)

20 parts trimethylolpropane triacrylate 2 parts benzophenone which had been soaked in 0.1 N iodine in potassium iodide for 48 hours, for instance, contained 22% iodine and was brittle and cracked when flexed.

Thus the elastomeric article prepared according to the present invention is a shaped article which is suitable for printing and comprises (A) an insolubilized natural or synthetic dienoid homopolymer or copolymer, (B) between about 5 and 50 phr of a photopolymerized crosslinking agent derived from a photo polymerizable ethylenically unsaturated compound and (C) between about 0.1 and 5 phr of a photoinitiator activatable by actinic radiation, said article containing between about 1% and 15% (based upon the weight of the article) of combined iodine.

In order to measure the tackiness of the plates, the following test was used:

A pair of 1 inch square sections of a processed (exposed, washed out and dried) plate was pressed face-to-face for 16 hours under a pressure of 2.5 psi. The degree of force required to pull the two pieces apart by hand was then determined, and recorded in terms of degree of adhesion; with a range of "could not be separated" to "tack-free."

For determination of the degree of resistance to actinic post-hardening, samples of processed plate were exposed to various light sources (i.e. sunlight, fluorescent light) for periods of time up to 2 months. Changes in hardness were measured in terms of the Shore "A" durometer value.

EXAMPLE 1

A 0.125" thick flexographic plate, comprising a 5 mil polyester film containing thereon the following composition:

100 parts butadiene-acrylonitrile copolymer (30% acrylonitrile)
20 parts trimethylolpropane triacrylate
2 parts benzophenone was irradiated with high intensity ultraviolet ("black light") tubes for 5 minutes on its underside and for 10 minutes on its face through a black and white photographic transparency containing textual material and large clear and opaque areas. The unexposed areas were then washed out in a rotary brush unit with perch loroethylene and the resultant processed plate dried at 150° F. One inch squares of the plate were then cut out and pairs of these samples were treated as described below:
(a) untreated
(b) immersed in 0.1 N aqueous iodine in potassium iodide solution for one minute.
(c) immersed for 30 seconds in a mixture of 9 parts commercial laundry bleach (sodium hypochlorite 5.25%), 1 part concentrated hydrochloric acid and 90 parts water.

The samples were all rinsed with water and dried at 150° F. The pairs of treated samples were tested for tackiness by the test described above, by being pressed together, face-to-face, for 16 hours at 2.5 psi pressure. The results were:
(a) Untreated—very tacky, could not be separated without tearing of the rubber at the interface.
(b) Iodine-treated—tack-free, could be separated easily.
(c) Chlorine-treated—tack-free, could be separated easily.

EXAMPLE 2

Samples of processed flexographic plate similar to those used for Example 1 were treated for various times, as shown below, with either 0.1 or 0.1 N iodine solution in potassium iodide. They were then tested for tackiness as described above, with results as shown below:

|  | 15 sec. | 30 sec. | 60 sec. |
|---|---|---|---|
| 0.01N $I_2$ in KI | Tacky, some tearing | Slightly tacky | Slightly tacky |
| 0.1N $I_2$ KI | Very slightly tacky | Very slightly tacky | Very slightly tacky |

This demonstrates that lower concentrations of iodine are effective, but require longer treating times.

EXAMPLE 3

To illustrate the protective effect of the iodination treatment of the present invention as compared with results obtained as a result of chlorination, the following experiment was performed. Photopolymer plates were made from the same formula used in Example 1, except that 2 parts of 2,6-di-tert-butyl-4-methylphenol were added. The compound was dissolved in a 1:2.8 mixture of methyl ethyl ketone-toluene and cast on a 5 mil polyester film in multiple passes, with drying, until a sheet thickness of 0.250" was achieved. Samples of this sheet were processed into flexographic plates, as described in Example 1, except that 3 different irradiation conditions were employed:

A: 15 minutes bottom side irradiation with no transparency 15 minutes top side irradiation with a black and white transparency
B: 9 minutes bottom and 15 top side, as in A.
C: 5 minutes bottom and 15 top side, as in A.

Pieces of the plate made by the 3 irradiation conditions were post-treated either with chlorine as in Example 1, or with the iodine-KI solution used in Example 1 for 5 minutes. They were then placed in a window and exposed to direct sunlight, and the hardness (Shore "A" Durometer) measured as a function of time. The results are shown in Table I.

TABLE I

| | Durometer (Shore A) after Days Exposure | | | | | | | | |
|---|---|---|---|---|---|---|---|---|---|
| | 0 Days | | 7 Days | | 24 Days | | 54 Days | | 90 Days | |
| | $Cl_2$ | $I_2$ | $Cl_2$ | $I_2$ | $Cl_2$ | $I_2$ | $Cl_2$ | $I_2$ | $Cl_2$ | $I_2$ |
| A | 45 | 45 | 72 | 44 | 76 | 46 | 77 | 47 | 78 | 51 |
| B | 41 | 42 | 72 | 38 | 76 | 42 | 77 | 46 | 79 | 48 |
| C | 36 | 37 | 71 | 36 | 76 | 38 | 78 | 42 | 79 | 45 |

EXAMPLE 4

A 0.070" flexographic plate on a 5 mil polyester support film, of the following composition:

100 parts styrene-isoprene-styrene block copolymer (14%-styrene)
8 parts hexanediol diacrylate
8 parts hexanediol dimethacrylate
2 parts 2,2-dimethoxy-2-phenylacetophenone
0.1 parts 3,5-di-tert-butyl-p-cresol was irradiated as in Example 1 for 15 seconds on its underside and 10 minutes, on its face through the same transparency as in Example 1. It was then processed similarly and dried. Pairs of one inch squares of this plate were tested for tack by the test employed in Example 1 with and without prior treatment for 5 minutes in 0.1 N aqueous $I_2$ in KI. The results were as follows:

Untreated—tacky, difficult to pull apart
Treated (with 0.1 N$I_2$ in KI for 5 minutes)—not tacky

EXAMPLE 5

A pair of one inch square samples of processed flexographic plate similar to those used in Example 1 were treated for 5 minutes in a solution of 5 g. of iodine in 200 ml. perchloroethylene. These samples were then rinsed in pure perchloroethylene and dried for 15 minutes at 150° F. After being pressed together face-to-face for 16 hours at 2.5 psi pressure, the samples showed no adhesion to each other.

EXAMPLE 6

Plates having the compositions disclosed in Examples 1 and 4 were treated for various durations with 0.1 N iodine dissolved in aqueous potassium iodide (KI) or 5 g. iodine in 200 ml. perchloroethylene (PCE). The amounts of combined iodine in the plates were then determined and are listed in Table II.

TABLE II

| TREATMENT TIME | TREATMENT MEDIUM | AMOUNT OF COMBINED $I_2$ |
| --- | --- | --- |
| 15 sec. | Aq.KI | 4% |
| 5 min. | Aq.KI | 6% |
| 5 min. | PCE | 5% |
| 30 min. | Aq.KI | 6% |
| 48 hrs. | Aq.KI | 22% |

Both the detackification and protection against posthardening afforded by the iodine treatment are unexpected, since iodine, although a halogen, possesses a different reactivity pattern than chlorine or bromine and in addition has not been known to function as a light-protective agent. The primary reaction of halogens with dienoid rubbers is one of addition to the double bond in the rubber:

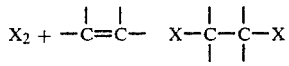

The diiodides, however, are unstable and decomposes readily at room temperature. Further, the action of iodine is neither a light screening action by virtue of its coloration nor is it acting as a conventional ultraviolet absorber. This was demonstrated experimentally by the finding that mere dying of the sample with a dark dye to duplicate the color of an iodine treated plate is without effect in either detackification or protection against actinic post-hardening. Similarly, coating a processed plate with a commercial ultraviolet absorber is without effect.

What we claim and desire to protect by Letters Patent is:

1. An elastomeric article suitable for printing comprising (A) an insolubilized natural or synthetic conjugated diolefin hydrocarbon homopolymer or copolymer, (B) between about 5 and 50 phr of a photopolymerized cross-linking agent derived from a photopolymerizable ethylenically unsaturated compound and (C) between about 0.1 and 5 phr of a photoinitiator activatable by actinic radiation, said elastomeric article containing (D) a detackifying amount of iodine.

2. The elastomeric article defined in claim 1 which contains between about 1 and 15%, based upon the weight of the article, of combined iodine.

3. The elastomeric article defined in claim 1 wherein (A) is a polymer selected from the group consisting of 1,4-polybutadiene and 1,2-polybutadiene, butadiene-acrylonitrile copolymer, butadiene-styrene copolymer, styrene-butadiene-styrene block copolymer and styrene-isoprene-styrene block copolymer.

4. The elastomeric article defined in claim 1 wherein (A) is a polymer selected from the group consisting of a butadiene-acrylonitrile copolymer, butadiene-styrene copolymer or a block copolymer of butadiene or isoprene with styrene.

5. The elastomeric article defined in claim 1 wherein (A) is a homopolymer selected from the group consisting of 1,4-polybutadiene and 1,2-polybutadiene.

6. The elastomeric article defined in claim 1 wherein (A) is a butadiene-acrylonitrile copolymer containing 2-50% by weight of acrylonitrile.

7. The elastomeric article defined in claim 1 wherein (A) is a butadiene-acrylonitrile copolymer containing 20-40% by weight of acrylonitrile.

8. The elastomeric article defined in claim 1 wherein (A) is a copolymer of butadiene and styrene.

9. The elastomeric article defined in claim 1 wherein (A) is a butadiene-styrene copolymer containing 21-45% by weight of copolymerized styrene.

10. The elastomeric article defined in claim 1 wherein (A) is a styrene-butadiene-styrene block copolymer containing 10-40% by weight of copolymerized styrene.

11. The elastomeric article defined in claim 1 wherein (A) is a styrene-isoprene-styrene block copolymer containing 10-40% by weight of copolymerized styrene.

12. The elastomeric article defined in claim 1 wherein (A) is 1,4-polybutadiene.

13. The elastomeric article defined in claim 1 wherein (A) is 1,2-polybutadiene.

14. The elastomeric article defined in claim 1 wherein (B) is derived from an ester of acrylic acid.

15. The elastomeric article defined in claim 1 wherein (B) is derived from an ester of methacrylic acid.

16. The elastomeric article defined in claim 1 wherein (B) is derived from a photopolymerizable ethylenically unsaturated compound selected from the group consisting of ethylene glycol diacrylate, ethylene glycol dimethacrylate, diethylene glycol diacrylate, diethylene glycol dimethacrylate, 1,4-butanediol diacrylate, 1,4-butanediol dimethacrylate, 1,6-hexanediol diacrylate, 1,6-hexanediol dimethacrylate, trimethylolpropane triacrylate, trimethylolpropane trimethacrylate.

17. The elastomeric article defined in claim 1 wherein (B) is derived from ethylene glycol diacrylate.

18. The elastomeric article defined in claim 1 wherein (B) is derived from ethylene glycol dimethacrylate.

19. The elastomeric article defined in claim 1 wherein (B) is derived from diethylene glycol diacrylate.

20. The elastomeric article defined in claim 1 wherein (B) is derived from diethylene glycol dimethacrylate.

21. The elastomeric article defined in claim 1 wherein (B) is derived from 1,4-butanediol diacrylate.

22. The elastomeric article defined in claim 1 wherein (B) is derived from 1,4-butanediol dimethacrylate.

23. The elastomeric article defined in claim 1 wherein (B) is derived from 1,6-hexanediol diacrylate.

24. The elastomeric article defined in claim 1 wherein (B) is derived from 1,6-hexanediol dimethacrylate.

25. The elastomeric article defined in claim 1 wherein (B) is derived from trimethylolpropane triacrylate.

26. The elastomeric article defined in claim 1 wherein (B) is derived from trimethylolpropane trimethacrylate.

27. The elastomeric article defined in claim 1 wherein (C) is benzophenone.

28. The elastomeric article defined in claim 1 wherein (C) is $C_1$-$C_5$ alkyl ethers of benzoin.

29. The elastomeric article defined in claim 1 wherein (C) is benzil.

30. The elastomeric article defined in claim 1 wherein (C) is $C_1$-$C_5$ alkyl monoketals of benzil.

31. The elastomeric article defined in claim 1 wherein (C) is 2,2-dimethoxy-2-phenylacetophenone.

32. The elastomeric article defined in claim 1 wherein (A) is a butadiene-acrylonitrile copolymer, ′B) is derived from 5–50 phr trimethylolpropane triacrylate and (C) is 0.1–5 phr benzophenone.

33. The elastomeric article defined in claim 1 wherein (A) is derived from a mixture of a styrene-isoprene-styrene block copolymer, (B) is 2.5–25 phr 1,6-hexanediol diacrylate and 2.5–25 phr 1,6-hexanediol dimethacrylate and (C) is a mixture of 0.1–1 phr 3,5-di-tert-butyl-p-cresol and 1–4 phr 2,2-dimethoxy-2-phenylacetophenone.

34. The process of detackifying an elastomeric article which is suitable for printing comprising contacting said article comprising (A) an insolubilized natural or synthetic conjugated diolefin hydrocarbon homopolymer or copolymer, (B) between about 5 and 50 phr of a photopolymerized cross-linking agent derived from a photopolymerizable ethylenically unsaturated compound and (C) between about 0.1 and 5 phr of a photoinitiator activatable by actinic radiation, with iodine, for a sufficient time to obtain said elastomeric article containing a detackifying amount of iodine.

35. The process defined in claim 34 wherein said article is contacted with an aqueous iodine in potassium iodide treating solution of between about 0.01 and about 10 normal.

36. The process defined in claim 34 wherein said article is contacted with a solution of iodine in a non-aqueous solvent of concentration between 1 and 10 weight percent.

37. The process defined in claim 36 wherein said non-aqueous solvent is perchloroethylene.

* * * * *

UNITED STATES PATENT OFFICE
CERTIFICATE OF CORRECTION

PATENT NO. : 4,292,150

DATED : September 7, 1982

INVENTOR(S) : Milton Farber et al

It is certified that error appears in the above—identified patent and that said Letters Patent are hereby corrected as shown below:

Claim 33 should be changed to read:

The elastomeric article defined in claim 1 wherein (A) is [derived from a mixture of] a styrene-isoprene-styrene block copolymer, (B) is derived from a mixture of 2.5-25 phr 1,6-hexanediol diacrylate and 2.5-25 phr 1,6-hexanediol dimethacrylate and (C) is derived from a mixture of 0.1-1 phr 3,5-di-tert-butyl-p-cresol

UNITED STATES PATENT AND TRADEMARK OFFICE
CERTIFICATE OF CORRECTION

PATENT NO. : 4,292,150

DATED : September 7, 1982

INVENTOR(S) : Milton Farber et al.

It is certified that error appears in the above-identified patent and that said Letters Patent is hereby corrected as shown below:

and 1-4 phr 2,2-dimethoxy-2-phenylaceto-phenone.

Signed and Sealed this

Twenty-sixth Day of October 1982

[SEAL]

Attest:

Attesting Officer

GERALD J. MOSSINGHOFF

Commissioner of Patents and Trademarks